(12) United States Patent
Minegishi

(10) Patent No.: US 8,516,669 B2
(45) Date of Patent: Aug. 27, 2013

(54) METHOD OF MANUFACTURING PIEZOELECTRIC VIBRATING REED, PIEZOELECTRIC VIBRATOR, OSCILLATOR, ELECTRONIC EQUIPMENT AND RADIO-CONTROLLED TIMEPIECE

(75) Inventor: Takashi Minegishi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 274 days.

(21) Appl. No.: 13/035,604

(22) Filed: Feb. 25, 2011

(65) Prior Publication Data

US 2011/0193647 A1 Aug. 11, 2011

Related U.S. Application Data

(63) Continuation of application No. PCT/JP2008/065369, filed on Aug. 28, 2008.

(51) Int. Cl.
*H01L 41/22* (2006.01)

(52) U.S. Cl.
USPC .......................................... 29/25.35; 331/156

(58) Field of Classification Search
USPC ...................... 29/25.35; 331/156; 310/370
See application file for complete search history.

(56) References Cited

U.S. PATENT DOCUMENTS

| | | | |
|---|---|---|---|
| 2002/0084718 A1 | 7/2002 | Nakagawa et al. | |
| 2005/0194352 A1* | 9/2005 | Satoh et al. | 216/41 |

FOREIGN PATENT DOCUMENTS

| | | | |
|---|---|---|---|
| JP | 05-152878 | A | 6/1993 |
| JP | 06-150237 | A | 5/1994 |
| JP | 2001-077653 | A | 3/2001 |
| JP | 2002-076806 | A | 3/2002 |
| JP | 2007-013383 | A | 1/2007 |
| JP | 2007-088542 | A | 4/2007 |
| JP | 2008-172572 | A | 7/2008 |

OTHER PUBLICATIONS

International Search Report for International Application No. PCT/JP2008/065369, dated Oct. 14, 2008, 2 pages.

* cited by examiner

*Primary Examiner* — Joseph Chang
(74) *Attorney, Agent, or Firm* — Brinks Hofer Gilson & Lione

(57) ABSTRACT

A method of manufacturing a piezoelectric vibrating reed from a wafer, the piezoelectric vibrating reed including a pair of vibration arm portions that is arranged in parallel, a base portion that integrally fixes proximal end sides of the pair of vibration arm portions, and groove portions which are formed on both surfaces of the pair of vibration arm portions along the longitudinal direction of the vibration arm portions, respectively, the method including a protective film forming process of forming a protective film in an area other than a position corresponding to the groove portions in the wafer; and a groove portion forming process of forming the groove portions by using the protective film as a mask to perform dry etching with respect to the wafer, wherein, in the protective film forming process, a first protective film forming process of forming the protective film of a predetermined thickness with respect to a first surface of the wafer and a second protective film forming process of forming the protective film of a predetermined thickness with respect to a second surface of the wafer are alternatively performed several times.

9 Claims, 18 Drawing Sheets

METHOD OF MANUFACTURING PIEZOELECTRIC VIBRATING REED, PIEZOELECTRIC VIBRATOR, OSCILLATOR, ELECTRONIC EQUIPMENT AND RADIO-CONTROLLED TIMEPIECE

RELATED APPLICATIONS

This application is a continuation of PCT/JP2008/065369 filed on Aug. 28, 2008. The entire content of this application is incorporated herein by reference.

TECHNICAL FIELD

The present invention relates to a method of manufacturing a piezoelectric vibrating reed in which a groove portion is formed in a vibration arm portion, a piezoelectric vibrator having the piezoelectric vibrating reed, an oscillator, electronic equipment and a radio-controlled timepiece having the piezoelectric vibrator.

BACKGROUND ART

In recent years, piezoelectric vibrators having piezoelectric vibrating reed using crystals or the like have been used in mobile phones or personal digital assistants, as a time source or a timing source of a control signal, a reference signal source and the like.

In the piezoelectric vibrator, miniaturization is further desired due to the miniaturization of equipment to be mounted thereon. As a method of promoting miniaturization, several methods have been considered, but as one of them, there is a method of using a tuning fork type of piezoelectric vibrating reed in which a groove portion is formed on both surfaces of a vibration arm portion.

Usually, the tuning fork type of piezoelectric vibrating reed has a pair of vibration arm portions which is arranged in parallel to each other and has the proximal end side integrally fixed to a base portion, and an excitation electrode that is formed on the outer surfaces (including a grove portion) of the pair of vibration arm portions and vibrates the pair of vibration arm portions.

The excitation electrode is an electrode which vibrates the pair of vibration arm portions in a direction approaching and retreating from each other at a predetermined resonance frequency, and is electrically connected to a mount electrode formed on the outer surface of the base portion via a lead-out electrode. Moreover, the voltage is applied the piezoelectric vibrating reed via the mount electrode.

Herein, in a case where the groove portion is formed in the pair of vibration arm portions, as shown in FIG. 27, two excitation electrodes 93 and 94 with different polarities are formed on the side surfaces of the vibration arm portions 90 and 91 and on the side surface of the groove portion 92. At this time, since two excitation electrodes 93 and 94 are in an opposed positional relationship, as compared to a case where the groove portion 92 is not formed, an electric field is more effectively apt to act. For that reason, even when the size of the piezoelectric vibrating reed 95 is miniaturized, the vibration loss is low and a CI (equivalent resistance value) can be actively suppressed. Thus, there is an advantage in that it is suitable for miniaturization.

However, the piezoelectric vibrating reed 95 is generally manufactured by etching a wafer substrate such as a crystal (e.g., see Patent Citation 1). Moreover, in a case where the piezoelectric vibrating reed 95 having the groove portion 92 is manufactured, after the exterior shape of the piezoelectric vibrating reed 95 is formed in an initial etching process, the groove portion 92 is formed in the next etching process. At this time, the process is performed by a wet etching using a liquid agent such as hydrogen fluoride water.

[Patent Citation 1] Japanese Patent No. 3729249

However, in the method of the related art, the following problem remains.

Firstly, the etching process by wet etching has a property of being affected by a surface orientation of crystal of the wafer substrate. For that reason, in the method of the related art in which the process of the exterior shape and the process of the groove portion 92 are performed by wet etching, the side surface or the bottom surface of the etched groove portion 92 does not become the flat surface but becomes a distorted shape as shown in FIG. 28, and an irregularity in the surface occurs. Moreover, since the exterior shape is also processed by wet etching, not only the groove portion 92, but also vibration arm portions 90 and 91 or the side surface of the base portion also do not become the flat surface but become the distorted shape. For that reason, it is impossible to accurately form the groove portion 92 in a desired shape in the piezoelectric vibrating reed 95. Furthermore, an additional etching may be necessary depending on the extent of the irregularity in the surface.

Moreover, when the shape of the groove portion 92 forms the excitation electrodes 93 and 94 in the state as shown in FIG. 28, the excitation electrodes 93 and 94 are not in a secure opposed positional relationship, with the result that the CI value cannot be set at the designed value. In addition, there is a concern that each electrode may be shortened. Thus, high quality and high performance are difficult to promote.

On the other hand, in a case where the above-mentioned etching is performed not by wet etching but by a dry etching, it is not affected by the surface orientation of crystal, the above-mentioned problem does not occur. However, when dry etching is adopted, the following problem occurs.

When performing dry etching, generally, after a protective film is formed in an area other than an area where the etching is performed on the wafer substrate surface, the wafer substrate is subjected to dry etching and is processed to a desired shape. Herein, since there is a need to deeply dig the wafer substrate in forming the groove portion 92 in the wafer substrate, a film of a hard metallic element such as Ti, Ni or Cr is adopted as the protective film, and it is necessary to increase the thickness of the protective film. However, since the stress is great on the film of the hard metallic element, when the thickness of the protective film is thickened, there is a problem in that bending of the wafer substrate may occur. That is, there is a concern that it may be impossible to form a desired groove portion 92 even when dry etching is performed in the state in which the wafer is bent.

The present invention was made in view of the above circumstances, and an object thereof is to provide a method of manufacturing a piezoelectric vibrating reed that can form a desired groove portion in a vibration arm portion by dry etching, furthermore, an oscillator, electronic equipment and a radio-controlled timepiece having the piezoelectric vibrator.

SUMMARY OF THE INVENTION

The present invention provides the following means to achieve the above-mentioned object:

According to the invention there is provided a method of manufacturing a piezoelectric vibrating reed from a wafer, the piezoelectric vibrating reed including: a pair of vibration arm portions that is arranged in parallel, a base portion that integrally fixes proximal end sides of the pair of vibration arm portions, and groove portions which are formed on both surfaces of the pair of vibration arm portions along the longitudinal direction of the vibration arm portions, respectively, the method having a protective film forming process of forming a protective film in an area other than a position corresponding to the groove portions in the wafer; and a groove portion forming process of forming the groove portions by using the protective film as a mask to perform dry etching with respect to the wafer, in the protective film forming process, a first protective film forming process of forming the protective film of a predetermined thickness with respect to a first surface of the wafer and a second protective film forming process of forming the protective film of a predetermined thickness with respect to a second surface of the wafer are alternatively performed several times.

In the method of manufacturing the piezoelectric vibrating reed according to the present invention, firstly, after the protective film is formed in an area other than a position corresponding to the groove portion in the wafer, by performing dry etching, it is possible to form the groove portion in a desired shape on both surfaces of the wafer without being affected by the plane orientation of crystal.

Herein, in the protective film forming process, the first protective film forming process and the second protective film forming process are alternately repeated, and the protective film is alternately formed on both surfaces of the wafer by a predetermined thickness to have a desired film thickness. Thus, it is possible to prevent bending from occurring in the wafer when forming the protective film in the wafer. That is, the predetermined thickness is a thin film to an extent in which bending does not occur even when the protective film is formed on the wafer. By alternately forming the protective film of the predetermined thickness with respect to both surfaces of the wafer, the protective film is formed while the stress generated on both surfaces of the wafer at the time of the protective film forming is offset. Thus, since bending is not generated in the wafer at the time of the protective film forming, by performing dry etching of the wafer, a desired groove portion can be formed.

In this manner, by performing the process of the groove portion by dry etching, an accurate process is possible, and the side surface and the bottom surface of the groove portion can be formed not as a distorted shape but as a flat surface. Thus, a designed excitation electrode can be formed on an outer surface of the piezoelectric vibrating reed, whereby the CI value can be further reduced compared to one manufactured using the method of the related art. Thus, high quality and high performance can be promoted.

Moreover, according to the invention, there is provided a method of manufacturing the piezoelectric vibrating reed from a wafer, the piezoelectric vibrating reed including a pair of vibration arm portions that is arranged in parallel, a base portion that integrally fixes proximal end sides of the pair of vibration arm portions, and groove portions which are formed on both surfaces of the pair of vibration arm portions along the longitudinal direction of the vibration arm portions, respectively, the method having a protective film forming process of forming a protective film in an area other than a position corresponding to the groove portions in the wafer; and a groove portion forming process of forming the groove portions by performing dry etching with respect to the wafer, in the protective film forming process, the protective film is concurrently formed with respect to both surfaces of the wafer.

In the method of manufacturing the piezoelectric vibrating reed according to the present invention, firstly, after the protective film is formed in an area other than a position corresponding to the groove portion in the wafer, by performing dry etching, it is possible to form the groove portion in a desired shape on both surfaces of the wafer without being affected by the plane orientation of crystal.

Herein, in the protective film forming process, since the protective film is concurrently formed on both surfaces of the wafer, it is possible to prevent bending from occurring in the wafer when forming the protective film on the wafer. That is, by concurrently forming the protective film on both surfaces of the wafer, the protective film is formed while the stress generated on both surfaces of the wafer at the time of the protective film forming is offset. Thus, since bending is not generated in the wafer at the time of the protective film forming, by performing dry etching of the wafer, a desired groove portion can be formed.

In this manner, by performing the process of the groove portion by dry etching, an accurate process is possible, and the side surface and the bottom surface of the groove portion can be formed not as a distorted shape but as a flat surface. Thus, a designed excitation electrode can be formed on an outer surface of the piezoelectric vibrating reed, whereby the CI value can be further reduced compared to one manufactured by the method of the related art. Thus, high quality and high performance can be promoted.

Furthermore, a piezoelectric vibrator according to the present invention has the piezoelectric vibrating reed manufactured by the manufacturing method of the present invention.

Since the piezoelectric vibrator according to the invention has a piezoelectric vibrating reed in which a groove portion is accurately processed by dry etching, high quality of the piezoelectric vibrating reed can be promoted. Furthermore, an excitation electrode formed on an outer surface (outer surface including the groove portion) of the piezoelectric vibrating reed is also accurately formed. For that reason, the CI value can be reduced compared to the related art, and high performance of the piezoelectric vibrating reed can be promoted. As such piezoelectric vibrating reed, for example, there is a cylinder package type of piezoelectric vibrator or a box-shaped ceramic package type of piezoelectric vibrator.

Furthermore, an oscillator according to the present invention is configured so that the piezoelectric vibrator of the present invention is electrically connected to an integrated circuit as an oscillating element.

Furthermore, electronic equipment according to the present invention is configured so that the piezoelectric vibrator of the present invention is electrically connected to a clock section.

Furthermore, a radio-controlled timepiece according to the present invention is configured so that the piezoelectric vibrator of the present invention is electrically connected to a filter portion.

Since the oscillator, the electronic equipment, and the radio-controlled timepiece according to the present invention have the above-mentioned piezoelectric vibrator, similarly, high quality and high performance can be promoted.

With the method of manufacturing piezoelectric vibrating reed according to the present invention, in the protective film forming process, since the protective film is alternately formed on both surfaces of the wafer with a predetermined thickness to have a desired thickness, when the protective film is formed on the wafer, an occurrence of bending of the wafer can be prevented. That is, the predetermined thickness is a thin film of the extent in which bending does not occur even when the protective film is formed on the wafer, and by alternately forming the protective film of the predetermined thickness on both surfaces of the wafer, the protective film is formed while the stress generated on both surfaces of the wafer at the time of the protective film forming is offset. Thus, since bending is not generated in the wafer at the time of the protective film forming, by performing dry etching of the wafer, a desired groove portion can be formed.

DETAILED DESCRIPTION OF THE PREFERRED EMBODIMENTS

First Embodiment

Hereinafter, a first embodiment of a piezoelectric vibrating reed and the method of manufacturing the piezoelectric vibrating reed according to the present invention will be explained with reference to FIGS. 1 to 18.

Figure 1:
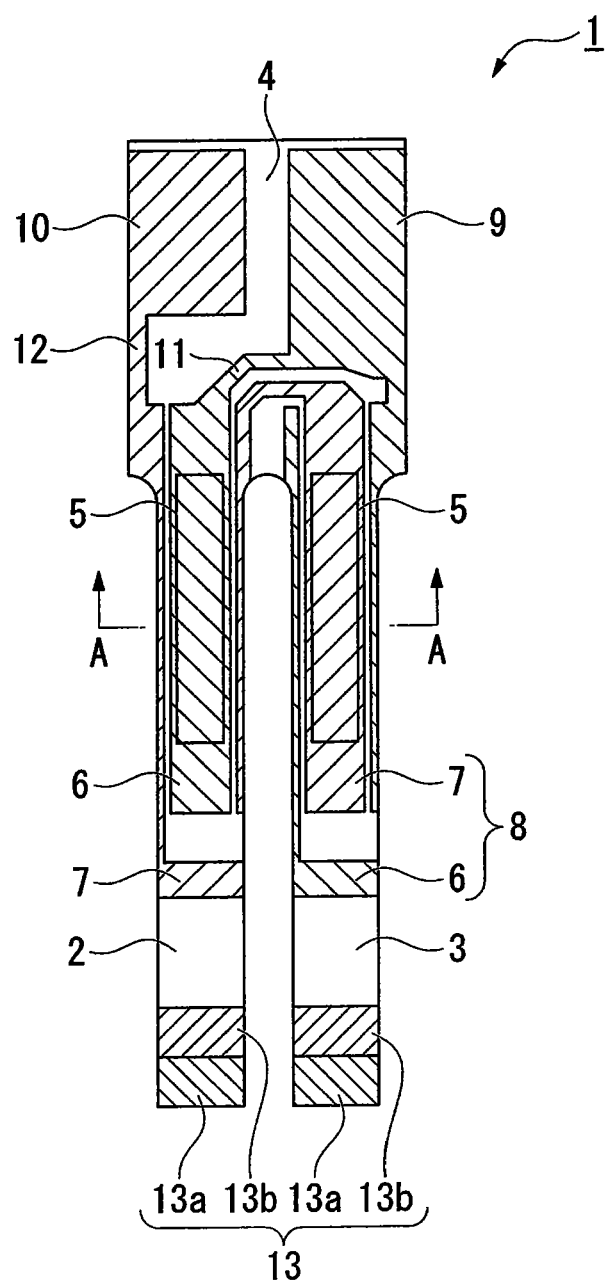
FIG. 1 is a diagram showing a piezoelectric vibrating reed from an upper surface that shows a first embodiment of a piezoelectric vibrating reed according to the present invention.
Figure 2:
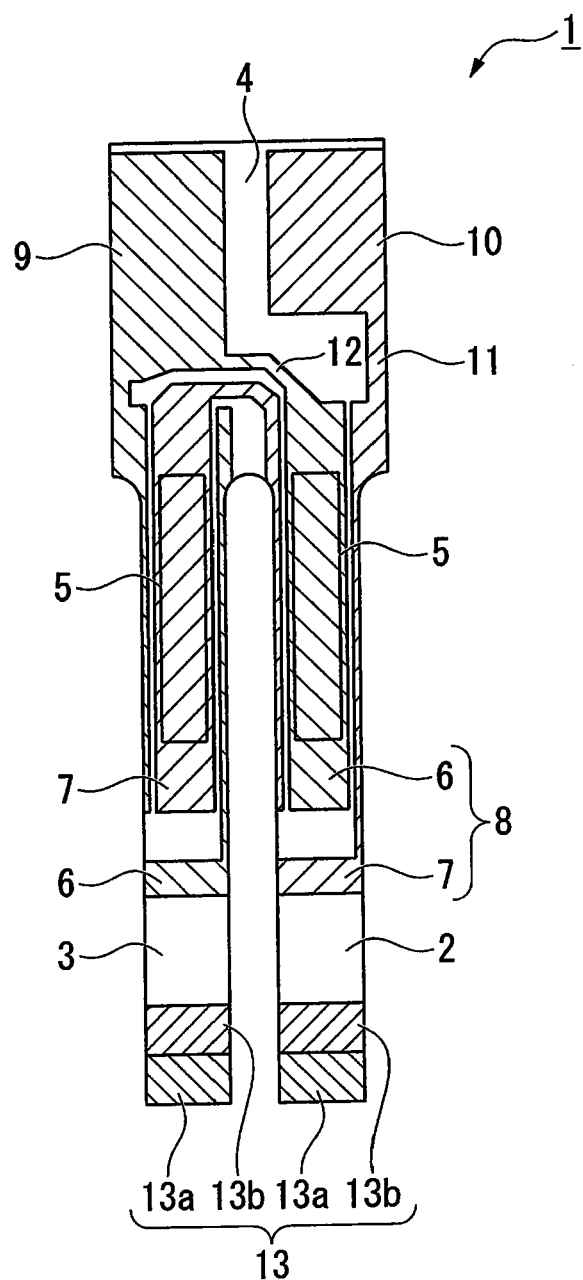
FIG. 2 is a diagram showing the piezoelectric vibrating reed shown in FIG. 1 from a lower surface.
Figure 3:
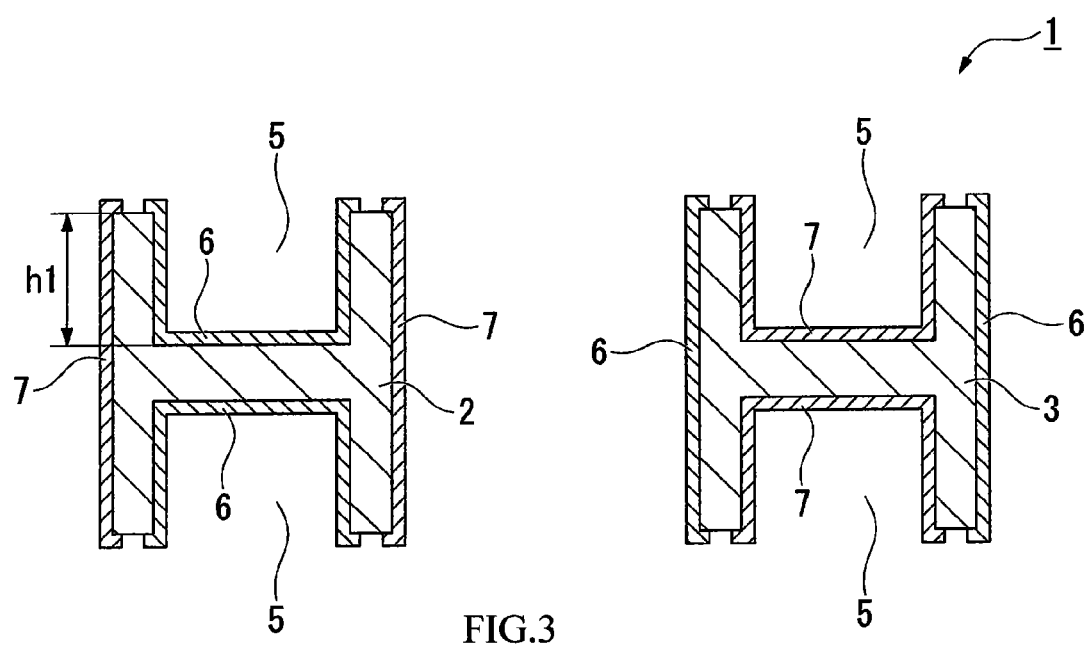
FIG. 3 is a cross-sectional view of a cutting line A-A shown in FIG. 1.

As shown in FIGS. 1 to 3, a piezoelectric vibrating reed 1 of the present embodiment includes: a pair of vibration arm portions 2 and 3 arranged in parallel, a base portion 4 which integrally fixes the proximal end sides of the pair of vibration arm portions 2 and 3, groove portions 5 which is formed on both sides of the pair of vibration arm portions 2 and 3, respectively, an excitation electrode 8 which is formed on outer surfaces of the pair of vibration arm portions 2 and 3 including the groove portions 5 and includes a first excitation electrode 6 and a second excitation electrode 7 that vibrate the pair of vibration arm portions 2 and 3, and mount electrodes 9 and 10 that are electrically connected to both vibration electrodes 6 and 7.

Figure 4:
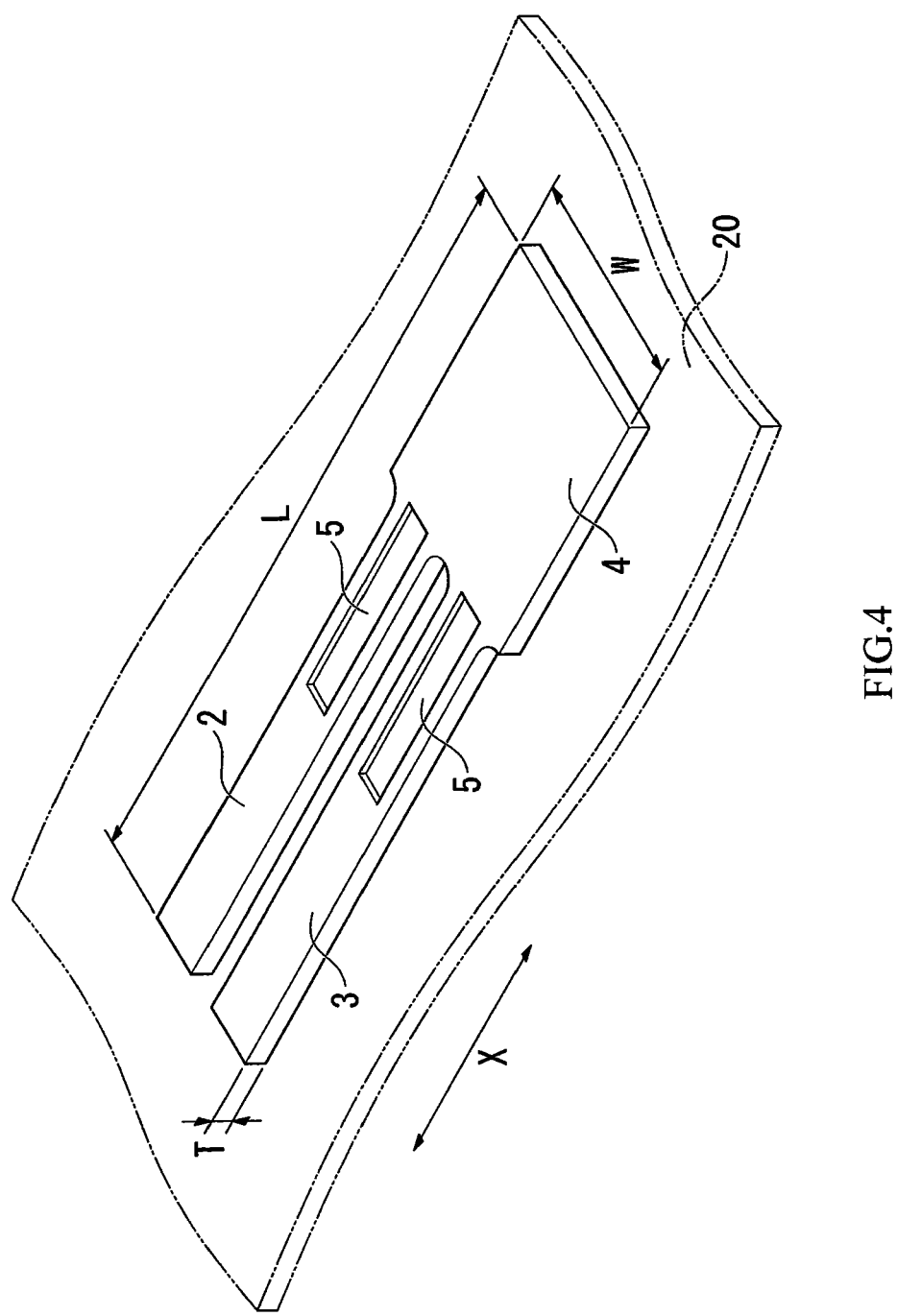
FIG. 4 is a perspective view of a state in which an electrode portion is removed from the piezoelectric vibrating reed shown in FIG. 1.

As shown in FIG. 4, the groove portions 5 are formed along the longitudinal direction X of the pair of vibration arm portions 2 and 3, and are formed from base portions 4 of the vibration arm portions 2 and 3 up to approximately near the middle thereof. In addition, in FIG. 4, the respective electrodes are omitted.

The excitation electrodes 8 including the first excitation electrode 6 and the second excitation electrode 7 are electrodes that vibrate the pair of vibration arm portions 2 and 3 in an direction approaching and separating each other by a predetermined resonant frequency, and are patterned and formed on the outer surfaces of the pair of vibration arm portions 2 and 3 in a state of being electrically separated, respectively. Specifically, as shown in FIG. 3, the first excitation electrode 6 is mainly formed on the groove portion 5 of one vibration arm portion 2 and on both side surfaces of the other vibration arm portion 3, and the second excitation electrode 7 is mainly formed on both side surfaces of one vibration arm portion 2 and on the groove portion 5 of the other vibration arm portion 3.

Furthermore, as shown in FIGS. 1 and 2, the first excitation electrode 6 and the second excitation electrode 7 are electrically connected to the mount electrodes 9 and 10 via lead-out electrodes 11 and 12 on both surfaces of the base portion 4, respectively. Moreover, the voltage is applied to the piezoelectric vibrating reed 1 via the mount electrodes 9 and 10.

In addition, the excitation electrode 8, the mount electrodes 9 and 10, and the lead-out electrodes 11 and 12 are formed, for example, by the coating of conductive films such as chromium (Cr), nickel (Ni), aluminum (Al) and titanium (Ti).

Furthermore, on the front ends of the pair of vibration arm portions 2 and 3, a metal weight film 13 for adjusting (frequency adjustment) so as to vibrate its own vibration state within a range of a predetermined frequency is coated. In addition, the metal weight film 13 is divided into a rough regulation film 13a used when roughly regulating the frequency and a minute regulation film 13b used when minutely regulating the frequency. By performing the frequency regulation using the rough regulation film 13a and the minute regulation film 13b, it is possible to limit the frequencies of the pair of vibration arm portions 2 and 3 within a range of a nominal frequency of a device.

As shown in FIG. 4, the piezoelectric vibrating reed 1 configured as above is manufactured from a wafer 20 which is formed of a piezoelectric material such as crystal, lithium tantalate or lithium niobate. At this time, the groove portion 5 is manufactured by the etching of the wafer 20 by dry etching. The manufacturing method will be explained later in more detail. Furthermore, the wafer 20 is sequentially subjected to two different etchings of dry etching and the wet etching, whereby the base portion 4 and the pair of vibration arm portions 2 and 3 are manufactured.

Moreover, as shown in FIG. 4, as an example of the size of the piezoelectric vibrating reed 1, the width W is about 0.5 mm to 0.6 mm, the overall length L is about 2.0 mm to 3.2 mm, a thickness T is about 0.10 mm, and the depth h1 (see FIG. 3) of the groove portion 5 is about 40 µm. Furthermore, the respective electrodes such as an excitation electrode 8 is a stack film of chromium (Cr) and gold (Au), for example, when the wafer 20 is crystal, and, after a chromium film having an excellent close contact property with crystal is formed as a base, a thin film of gold is applied to a surface thereof. In addition, for example, a thin film of gold may be stacked on the surface of the stack film of chromium and nichrome (NiCr) without being limited to the case.

In the case of operating the above-mentioned piezoelectric vibrating reed 1, a predetermined driving voltage is applied to the mount electrodes 9 and 10. As a result, the electric current can flow to the excitation electrode 8 including the first excitation electrode 6 and the second excitation electrode 7 via the lead-out electrodes 11 and 12, and the pair of vibration arm portions 2 and 3 can be vibrated in a direction approaching and separating each other by a predetermined frequency. Moreover, it is possible to use the vibration of the pair of vibration arm portions 2 and 3 as a time source, a timing source of a control signal, a reference signal source or the like.

Figure 5:
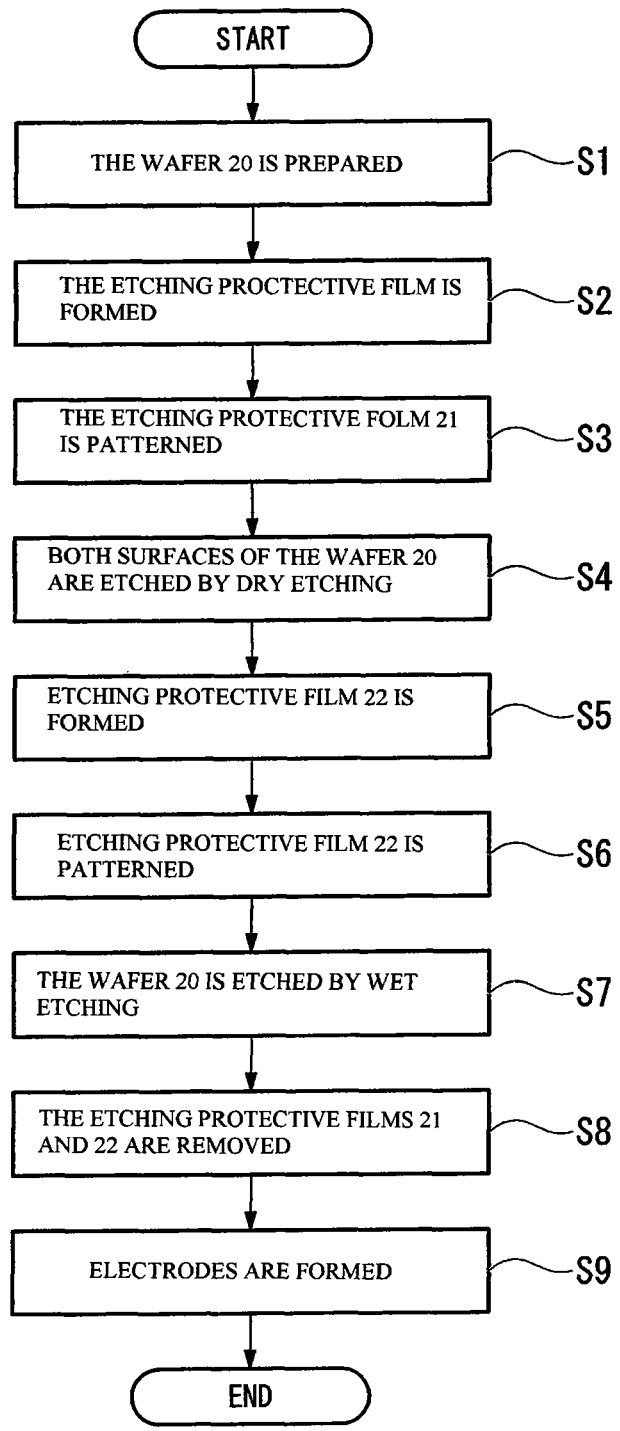
FIG. 5 is a flow chart of a manufacturing method of the piezoelectric vibrating reed shown in FIG. 1.

Next, a method of manufacturing the above-mentioned piezoelectric vibrating reed 1 will be explained with reference to a flow chart shown in FIG. 5 later.

The manufacturing method of the present embodiment is a method of manufacturing a plurality of piezoelectric vibrating reed 1 from the wafer 20 at a time by sequentially performing a protective film forming process, a patterning process, a first etching process, a protection process, a second etching process, and a removal process. The respective processes will be explained in detail.

Figure 6:
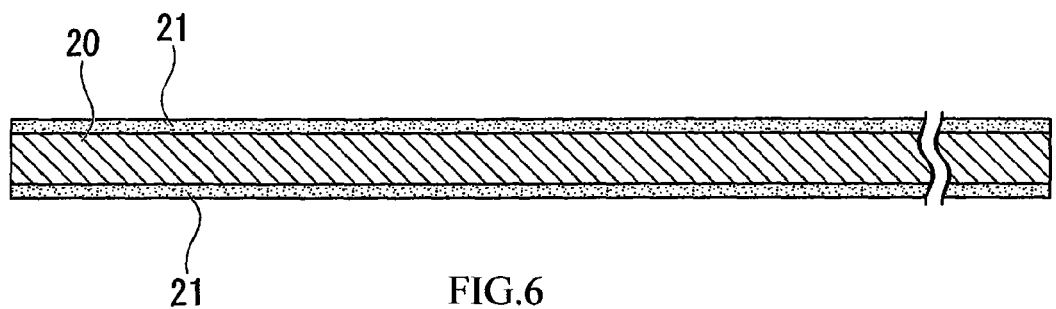
FIG. 6 is a process diagram of the flow chart shown in FIG. 5 that shows a state in which an etching protective film is formed on both surfaces of the wafer.

Firstly, in S1, the wafer 20 is prepared. Next, in S2, as shown in FIG. 6, on both surfaces of the wafer 20, an etching protective film 21, which protects the wafer 20 during of etching, is formed by sputtering or the like, respectively (a protective film forming process). As the etching protective film 21, for example, titanium (Ti) is formed as a film by about 3 µm.

Figure 7:
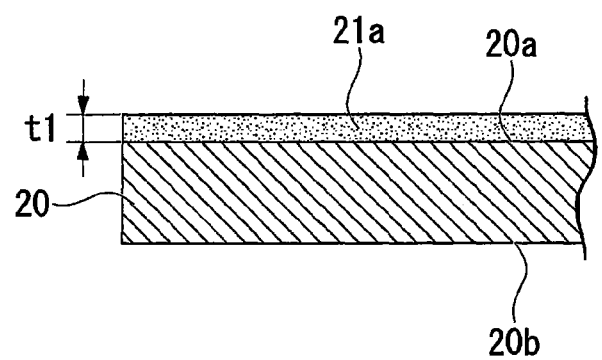
FIG. 7 is a partial cross-sectional view (1) of a step of forming the etching protective film.
Figure 8:
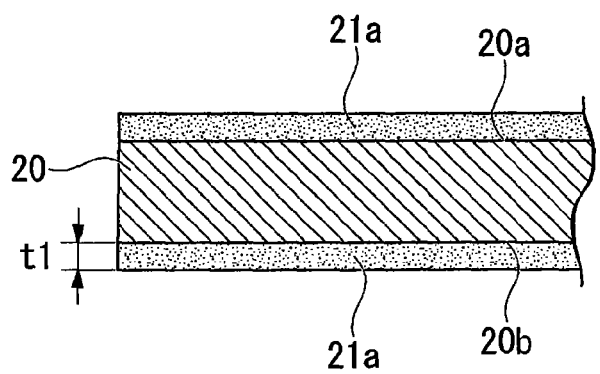
FIG. 8 is a partial cross-sectional view (2) of a step of forming the etching protective film.
Figure 9:
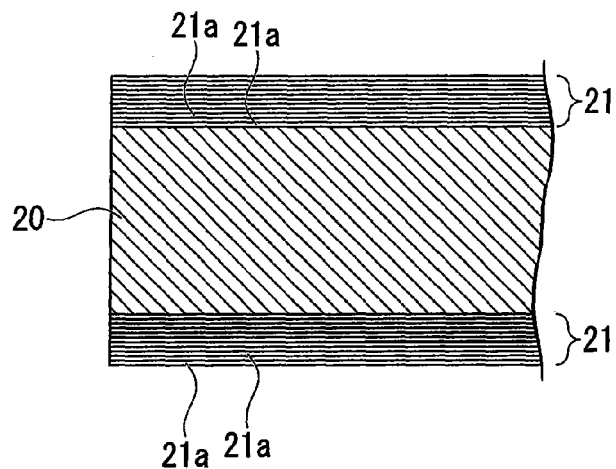
FIG. 9 is a partial cross-sectional view (3) of a step of forming the etching protective film.

Herein, in the present embodiment, the etching protective film 21 is alternately formed on both surfaces of the wafer 20 by a predetermined thickness to have a desired thickness. That is, as shown in FIG. 7, firstly, a protective film 21a of a predetermined thickness t1 (e.g., t1=0.25 µm) is formed on one surface 20a of the wafer 20 (a first protective film forming process). Next, as shown in FIG. 8, the protective film 21a of a predetermined thickness t1 is similarly formed on the other surface 20b of the wafer 20 (a second protective film forming process). Next, the protective film 21a of the predetermined thickness t1 is formed on one surface 20a of the wafer 20 again, and this process is repeated. Moreover, as shown in FIG. 9, when the protective films 21a of the predetermined thickness t1 are formed 12 times on the respective surfaces 20a and 20b, the etching protective films 21 of the thickness of about 3 µm are formed on both surfaces of the wafer 20, respectively. In this manner, when the protective film 21a is formed by the predetermined thickness t1, when forming the protective film on the wafer 20, it is possible to prevent bending from occurring in the wafer 20. In addition, when the protective film 21a is formed on one surface of the wafer 20 as described above, for example, the wafer 20 arranged in a sputtering device may be reversed for each predetermined time to perform the film formation while switching over the film formation surface.

Figure 10:
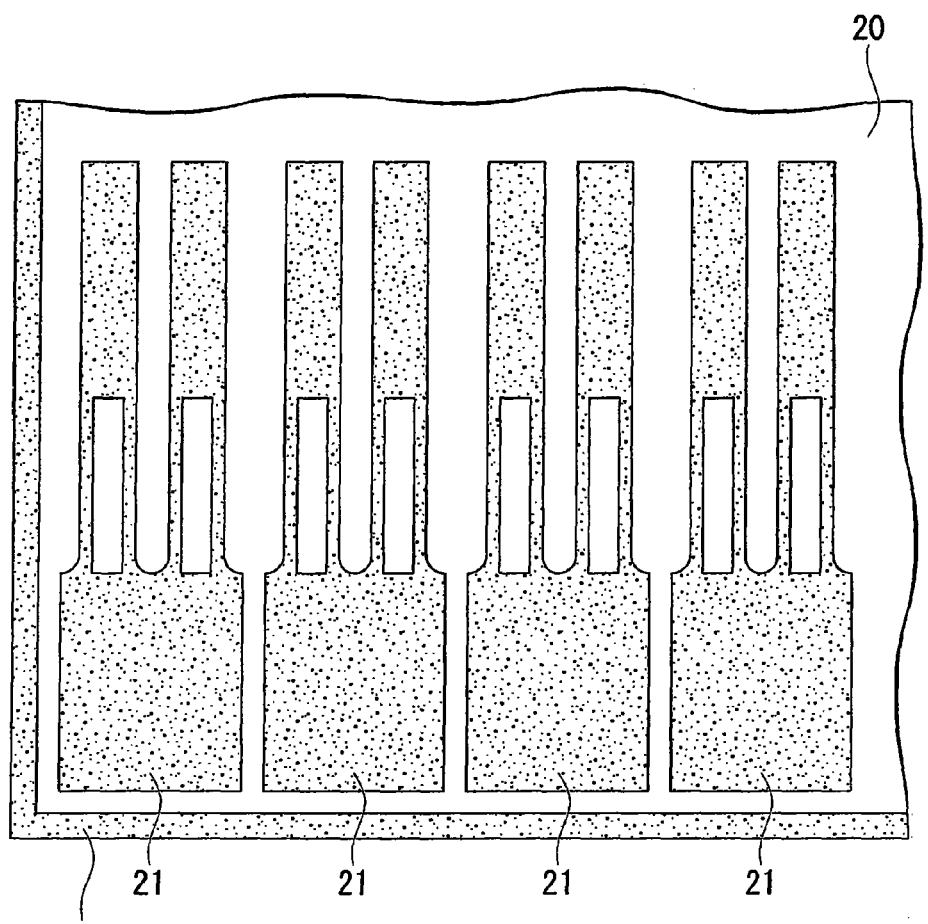
FIG. 10 is a diagram showing the wafer from the upper part which shows a state after the etching protective film is patterned from the state shown in FIG. 6.
Figure 11:
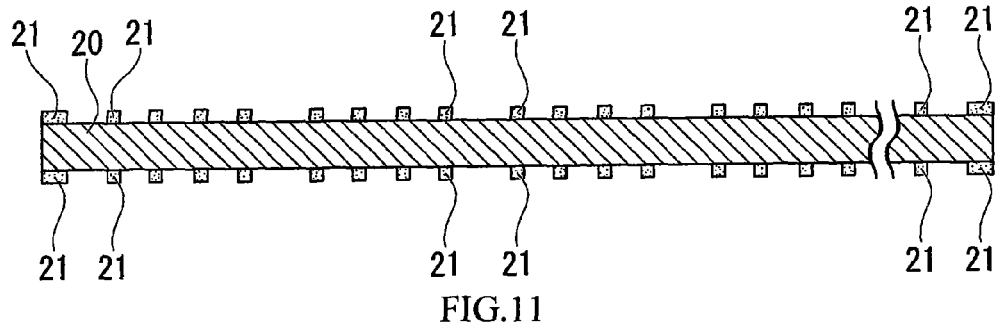
FIG. 11 is a diagram which shows a state after the etching protective film is patterned from the state shown in FIG. 6.

Next, in S3, the etching protective film 21 is patterned to an exterior shape of the piezoelectric vibrating reed 1 in a state in which the area of the groove portion 5 is empty (a patterning process). Specifically, firstly, a photoresist film (not shown) is patterned on the etching protective film 21 by a photolithography technique. At this time, the patterning is performed so as to surround the peripheries of the groove portion 5 and the piezoelectric vibrating reed 1. Moreover, the photoresist film is used as a mask to perform the etching, thereby selectively removing the etching protective film 21 which is not masked. Moreover, after the etching, the photoresist film is removed. As a result, as shown in FIGS. 10 and 11, the etching protective film 21 can be patterned to the above-mentioned shape. That is, in the state in which the area of the groove portion 5 is empty, it is possible to perform the patterning along the exterior shape of the piezoelectric vibrating reed 1, namely, the exterior shapes of the pair of vibration arm portions 2 and 3 and the base portion 4. Furthermore, at this time, the patterning is performed by the number of the plurality of piezoelectric vibrating reeds 1.

Figure 12:
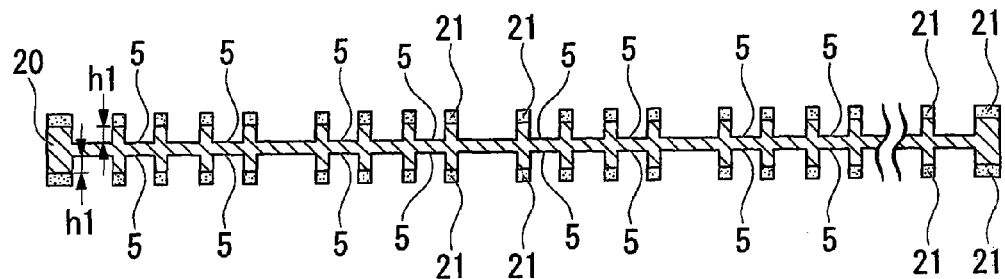
FIG. 12 is a diagram which shows a state in which the patterned etching protective film is used as a mask from the state shown in FIG. 11 and the wafer is etched by dry etching.

Next, in S4, the patterned etching protective film 21 is used as a mask, and both surfaces of the wafer 20 are etched by dry etching using a fluorine based gas (a first etching process). At this time, the wafer 20 is etched by the depth h1 of the groove portion 5. As a result, as shown in FIG. 12, the groove portions 5 can be formed on both surfaces of the wafer 20, and by removing the area where the etching protective film 21 is not masked from the surface by the depth h1 of the groove portion 5, the exterior shape of the piezoelectric vibrating reed 1 can be formed by the depth h1 of the groove portion 5. In addition, since bending does not occur in the wafer 20 in the present embodiment, the groove portion 5 can accurately be removed by the depth h1.

Figure 13:
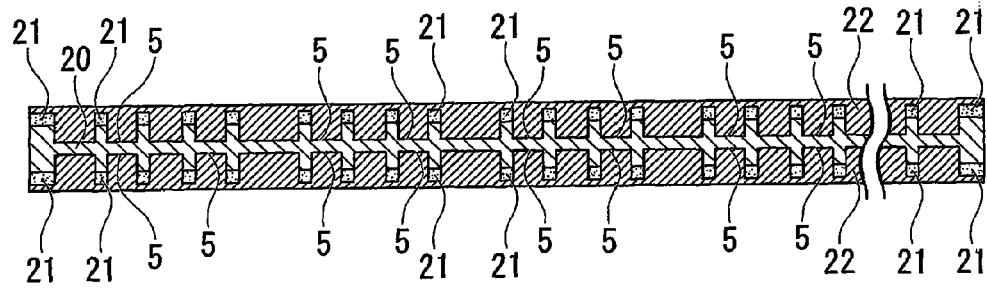
FIG. 13 is a diagram which shows a state in which individual etching protective films are formed on both surfaces of the wafer after the state shown in FIG. 10.

In addition, as shown in FIG. 12, the portion etched in the first etching process is in a state of being exposed without being masked by the etching protective film 21. Herein, in S5, an etching protective film 22, which protects the wafer 20 at the time of the etching processing, is formed only on the groove portion 5 among the exposed portions (a protection process). Specifically, as shown in FIG. 13, firstly, the etching protective films 22 are formed on both surfaces of the wafer 20, respectively. For example, the etching protective film 22 is a resin-based photoresist film, and is formed by mixedly carrying out a spray coating, or a spray coating and a spin coating. At this time, in the present embodiment, the film formation of the etching protective film 22 is performed until the etching protective film 21 formed in advance as well as the wafer 20 are completely concealed.

Figure 14:
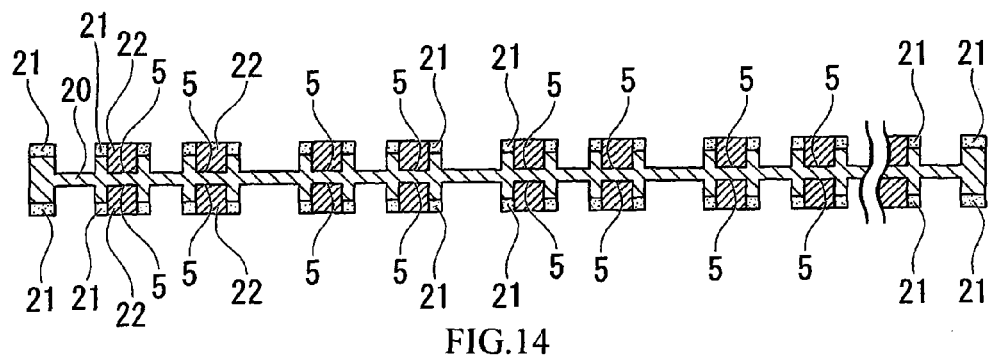
FIG. 14 is a diagram which shows a state after the etching protective film to be formed later is patterned from the state shown in FIG. 13.

Next, in S6, the etching protective film 22 formed is patterned by photolithography technique using a photoresist film (not shown) similarly to the patterning of the etching protective film 21, and only a portion of the groove portion 5 remains as shown in FIG. 14. As a result, the wafer 20 enters a state in which only an area surrounding the periphery of the piezoelectric vibrating reed 1 is exposed.

In addition, in the present embodiment, after the etching protective film 22 is firstly formed all over the surface of the wafer 20, the etching protective film 22 is formed only on the groove portion 5 by the patterning. However, it is not limited to this case, for example, after a mask (not shown), in which only the portion of the groove portion 5 is opened, is overlapped with the wafer 20, the etching protective film 22 may be formed via the mask. Even in this case, it is possible to form the etching protective film 22 only on the groove portion 5. In any case, if the etching protective film 22 is formed only on the groove portion 5, the method may be adopted.

Figure 15:
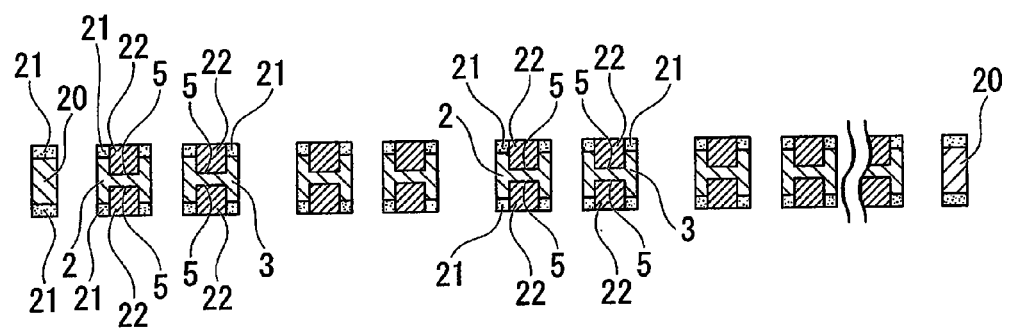
FIG. 15 is a diagram which shows a state in which two etching protective films are used as masks from the state shown in FIG. 14 and the wafer is etched by the wet etching.

Next, in S7, the etching protective film 21 formed in advance and the etching protective film 22 formed later are used as masks, and the wafer 20 is etched by wet etching by hydrofluoric acid or the like (a second etching process). At this time, the remaining portion of the wafer 20 etched by the depth h1 of the groove portion 5 from the surface in the first etching process is completely removed. That is, both surfaces of the wafer 20 are penetrated. As a result, as shown in FIG. 15, the pair of vibration arm portions 2 and 3 and the base portion 4 can be completely formed, and it is possible to obtain the piezoelectric vibrating reed 1 in which the pair of vibration arm portions 2 and 3 is integrally fixed to the base portion 4.

Figure 16:
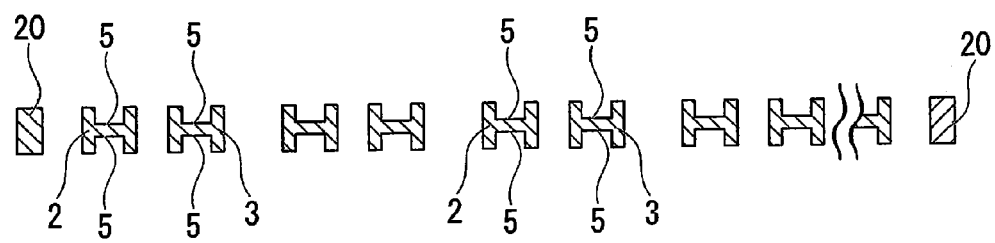
FIG. 16 is a diagram which shows a state in which two etching protective films are removed from the state shown in FIG. 15, thereby manufacturing a pair of vibration arm portions formed with a groove portion.

Moreover, in S8, as shown in FIG. 16, finally, the etching protective films 21 and 22 are removed, respectively (a removal process). As a result, it is possible to manufacture the piezoelectric vibrating reed 1 shown in FIG. 4 in which the grove portions 5 are formed on both surfaces of the pair of vibration arm portions 2 and 3.

Figure 17:
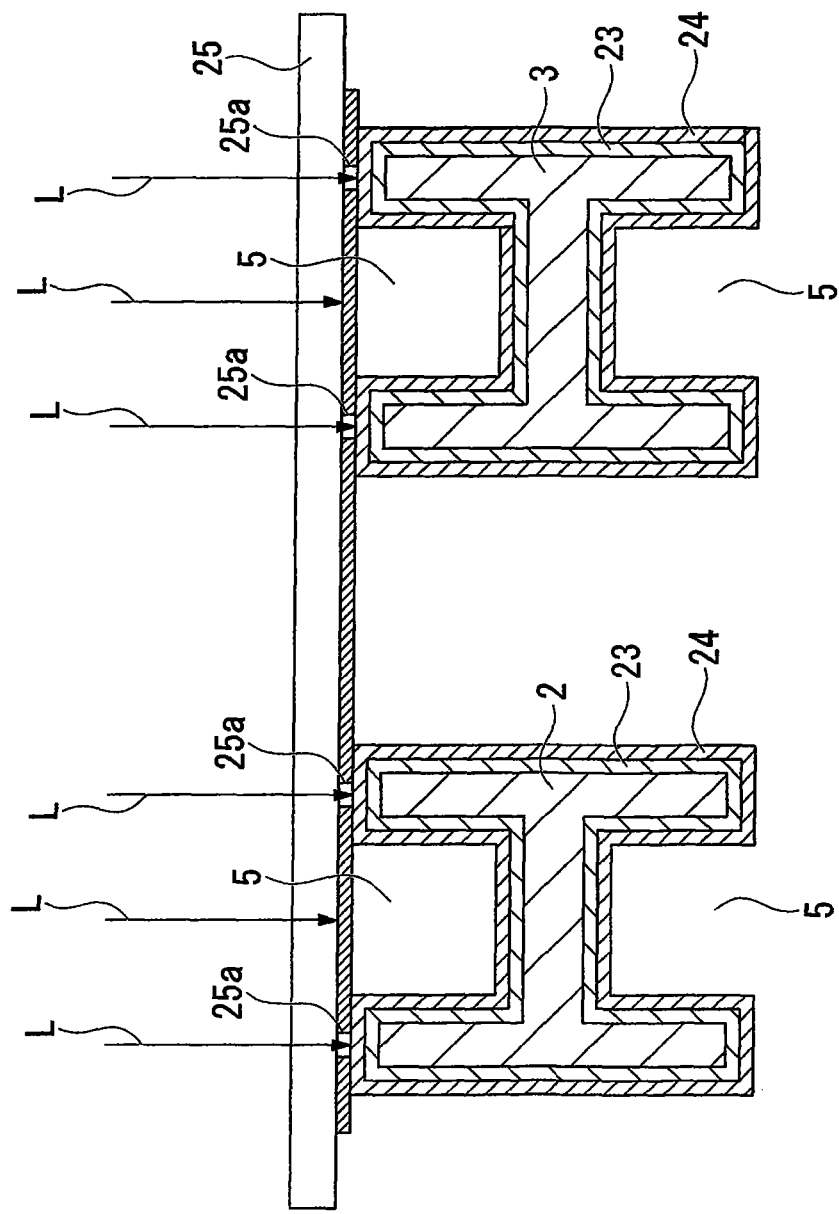
FIG. 17 is a diagram which shows a state in which, after a conductive film and a photoresist film are formed on outer surfaces of the pair of vibration arm portions from the state shown in FIG. 16, a predetermined position of the photoresist film is subjected to a light exposure.

Next, in S9, the excitation electrode 8, the lead-out electrodes 11 and 12, and the mount electrodes 9 and 10 are formed, respectively (an electrode forming process). Specifically, on the outer surface of the piezoelectric vibrating reed 1, as shown in FIG. 17, a conductive film 23, which becomes the excitation electrode 8, the lead-out electrodes 11 and 12, and the mount electrodes 9 and 10 later, is formed, and a positive type of photoresist film 24 is formed on the conductive film 23. Next, a photomask 25 formed with an opening portion 25a of a predetermined size is situated on the photoresist film 24. At this time, the photomask 25 is correctly positioned so that the opening portion 25a is situated on the vibration arm portions 2 and 3 with the groove portion 5 interposed therebetween. Next, a plane light L is irradiated from the upper part of the photomask 25 and the photoresist film 24 is exposed through the opening portion 25a. At this time, the photoresist film 24 enters the state in which only an area where the opening portion 25a is formed is exposed.

Figure 18:
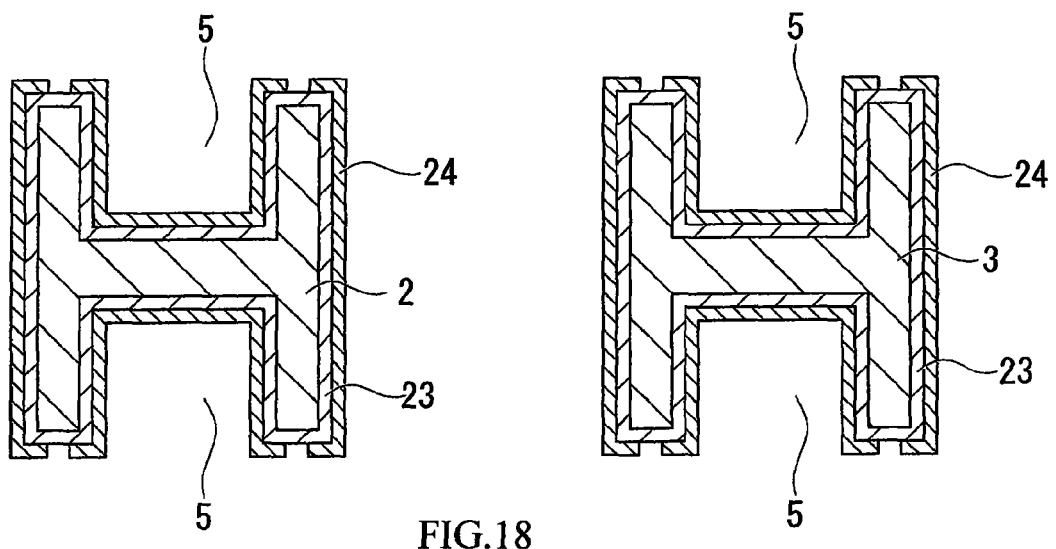
FIG. 18 is a diagram which shows a state in which the exposed photoresist film is develop from the state shown in FIG. 17.

Next, after removing the photomask 25a, the photoresist film 24 is developed. As a result, as shown in FIG. 18, the photoresist film 24 enters the state in which only the exposed area is removed. Moreover, after the photoresist film 24 is used as a mask to etch the conductive film 23, the photoresist film 24 is removed. As a result, as shown in FIG. 3, two excitation electrodes 8 having different polarities can be formed on the outer surfaces of the vibration arm portions 2 and 3 including the groove portion 5. Furthermore, the conductive film 23 can be formed even on the lead-out electrodes 11 and 12, the mount electrodes 9 and 10 and the metal weight film 13 at the same timing, respectively. As a result, the piezoelectric vibrating reed 1 shown in FIGS. 1 to 3 can be manufactured.

According to the manufacturing method of the present embodiment, after the etching protective film 21 is formed in an area other the position corresponding to the groove portion 5 in the wafer 20, by performing dry etching, it is possible to form the groove portion 5 in a desired shape which is not affected by the surface orientation of crystal, on both surfaces of the wafer 20.

Furthermore, since the protective films 21a of the predetermined thickness t1 are alternately formed on both surfaces of the wafer 20 to have the etching protective film 21 of the desired thickness, it is possible to prevent bending from occurring in the wafer 20. That is, the predetermined thickness t1 is a thin film (protective film 21a) of such an extent that bending does not occur even when the protective film is formed on the wafer 20, and by alternately forming the protective film 21a of the predetermined thickness t1 on both surfaces of the wafer 20, the etching protective film 21 is formed while the stress generated on both surfaces of the wafer 20 at the time of the protective film forming is offset. Thus, since bending is not generated in the wafer 20 at the time of the protective film forming, by performing dry etching of the wafer 20, a desired groove portion 5 can be formed.

As described above, by performing the process of the groove portion 5 by dry etching, an accurate process is possible, and the side surface and the bottom surface of the groove portion 5 can be formed not as a distorted shape but as a flat surface. Thus, a designed excitation electrode 8 can be formed on an outer surface of the piezoelectric vibrating reed 1, whereby the CI value can be reduced compared to one manufactured using the method of the related art.

That is, as shown in FIG. 3, one excitation elector 6 (7) formed on the side surface of the groove portion 5 and the other excitation electrode 7 (6) formed on the side surfaces of the vibration arm portions 2 and 3 can be in the correctly opposed positional relationship compare to the related art. For that reason, the CI value can be further reduced compared to one manufactured by the method of the related art. Thus, high quality and high performance can be promoted.

Second Embodiment

Figure 19:
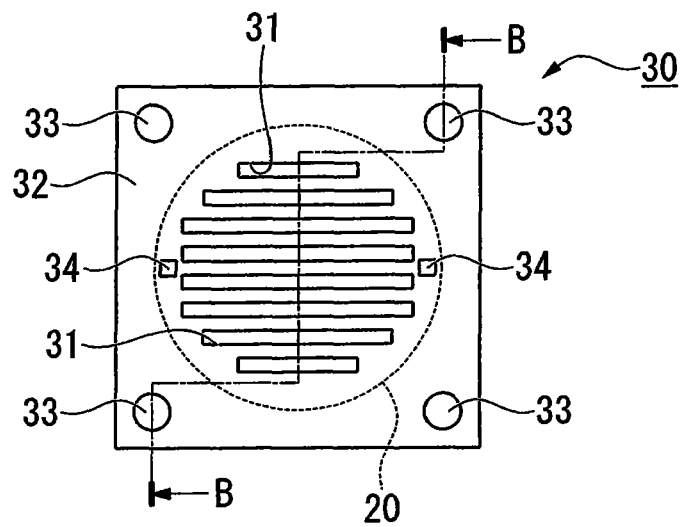
FIG. 19 is a front view of a jig used when spattering in a second embodiment of the invention.
Figure 20:
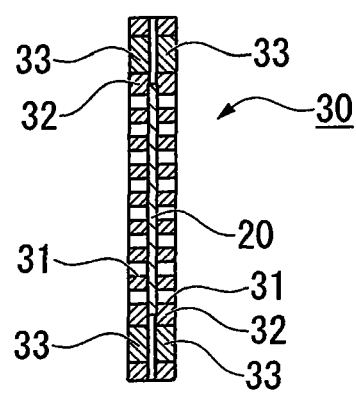
FIG. 20 is a cross-sectional view along line B-B of FIG. 19.

Next, a second embodiment of the manufacturing method of the piezoelectric vibrating reed according to the present invention will be explained with reference to FIGS. 19 and 20. In addition, in the second embodiment, the same portions as those in the first embodiment will be denoted by the same reference numerals and explanation thereof will be omitted.

The second embodiment is different from the first embodiment only in the method of forming the etching protective film 21 on the wafer 20, but other configurations are substantially the same.

Firstly, the wafer 20 is prepared (S1). Next, as shown in FIG. 6, on both surfaces of the wafer 20, an etching protective film 21, which protects the wafer 20 at the time of etching, is formed by sputtering or the like, respectively (S2). As the etching protective film 21, for example, titanium (Ti) is formed by about 3 μm.

Herein, in the present embodiment, the etching protective film 21 is concurrently formed on both surfaces of the wafer 20 to have a desired thickness. That is, when the etching protective film 21 is concurrently formed on one surface 20*a* and the other surface 20*b* of the wafer 20, it is possible to prevent bending from occurring in the wafer 20. In addition, in concurrently forming the etching protective film 21 on both surfaces of the wafer 20, for example, as shown in FIGS. 19 and 20, a jig 30 having an opening portion (a window frame) 31 in an area forming the etching protective film 21 of both surfaces of the wafer 20 is used. The jig 30 includes a pair of plate materials 32 and 32, and the opening portion 31 is formed suitably for the plate material 32. Furthermore, the wafer 20 can be interposed between the pair of plate members 32 and 32. Fixing magnets 33 are provided on four corners of the pair of plate materials 32 and 33, and when the wafer 20 is arranged on the jig 30, a positioning pin 34 for positioning the wafer 20 is provided. By attaching the wafer 20 to the jig 30 and arranging the jig 30 in a sputtering device (not shown), it is possible to concurrently form the etching protective film 21 on both sides of the wafer 20.

In the present embodiment, since the etching protective films 21 are concurrently formed on both surfaces of the wafer 20, it is possible to prevent bending from occurring in the wafer 20 when the etching protective film 21 is formed on the wafer 20. That is, by concurrently forming the etching protective film 21 on both surfaces of the wafer 20, the etching protective film 21 is formed while the stress generated on both surfaces of the wafer 20 is offset. Thus, since bending is not generated in the wafer 20 at the time of forming the etching protective film 21, by performing dry etching of the wafer 20, a desired groove portion 5 can be formed.

As described above, by performing the process of the groove portion 5 by dry etching, an accurate process is possible, and the side surface and the bottom surface of the groove portion 5 can be formed not as a distorted shape but as a flat surface. Thus, a designed excitation electrode 8 can be formed on an outer surface of the piezoelectric vibrating reed 1, whereby the CI value can be further reduced compared to one manufactured by the method of the related art. Thus, the high quality and the high performance can be promoted.

Next, an embodiment of a piezoelectric vibrator having the piezoelectric vibrating reed according to the present invention will be described with reference to FIG. 21. In addition, in the present embodiment, as the piezoelectric vibrator, a cylinder package type of piezoelectric vibrator will be explained as an example.

Figure 21:
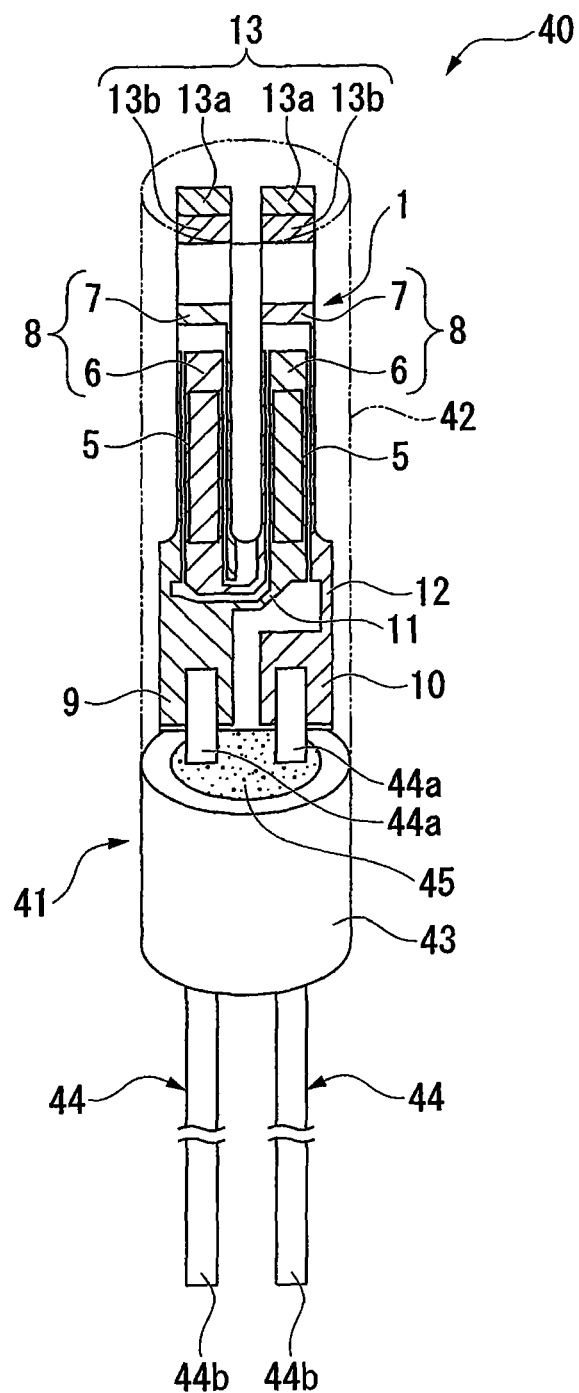
FIG. 21 is a diagram which shows an embodiment of a cylinder-shaped package type of piezoelectric vibrator having the piezoelectric vibrating reed according to the invention.

As shown in FIG. 21, a piezoelectric vibrator 40 of the present embodiment includes the piezoelectric vibrating reed 1, an airtight terminal 41, and a case 42 that is bonded to the airtight terminal 41 in a state of sealing the piezoelectric vibrating reed 1 therein.

The airtight terminal 41 includes an annulus stem 43, two leads 44 that are arranged so as to pass through the annulus stem 43, and are electrically and physically connected to both mount electrodes 9 and 10 of the piezoelectric vibrating reed 1, respectively, and a filling material 45 that integrally fixes the leads 44 and the stem 43 in the insulation state and seals the inner portion of the case 42.

The stem 43 is formed in the annular shape by metallic materials (e.g., low-carbon steel (Fe)), steel nickel alloy (Fe—Ni), and steel nickel cobalt alloy (Fe—Ni—Co)).

In addition, the heat-resistant solder plating or a metallic film (not shown) such as tin copper alloy or gold tin alloy is coated on the outer periphery of the stem 43. Furthermore, as the material of the filling material 45, for example, there is borosilicate glass. Furthermore, two leads 44 is configured so that a portion protruding to the inner portion of the case 42 becomes an inner lead 44*a* and a portion protruding to the outer portion of the case 42 becomes an outer lead 44*b*. Furthermore, the outer lead 44*b* functions as an external connection terminal.

The case 42 is pressed and bond-fixed into the outer periphery of the stem 43. Specifically, the case 42 and the stem 43 are fixed to each other by the cold pressure welding via the metallic film coated on the outer periphery of the stem 43. Since the pressing insertion of the case 42 is performed under the vacuum environment, the space surrounding the piezoelectric vibrating reed 1 in the case 42 is sealed in the state of being maintained in the vacuum.

According to the cylinder package type of piezoelectric vibrator 40 configured as above, since it has the piezoelectric vibrating reed 1 having high quality and high performance, the piezoelectric vibrator 40 itself can also promote high quality and high performance. Particularly, since the inner portion of the case 42 can be set as the vacuum state, the vibration efficiency of the pair of vibration arm portions 2 and 3 can be improved.

Piezoelectric Vibrator

Next, another example of the piezoelectric vibrator having the piezoelectric vibrating reed 1 according to the present invention will be explained with reference to FIGS. 22 and 23. In addition, in the present embodiment, as the piezoelectric vibrator, a ceramic package type of piezoelectric vibrator 50, in which the piezoelectric vibrating reed 1 is fixed to a box with a lid, will be explained as an example.

Figure 22:
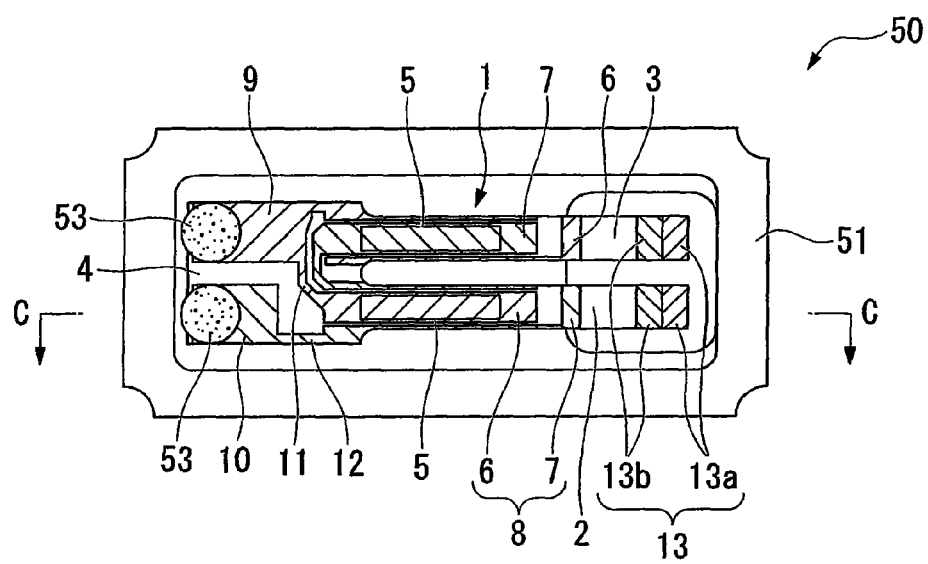
FIG. 22 is a cross-sectional view which shows an embodiment of a ceramic package type of piezoelectric vibrator having the piezoelectric vibrating reed according to the invention.
Figure 23:
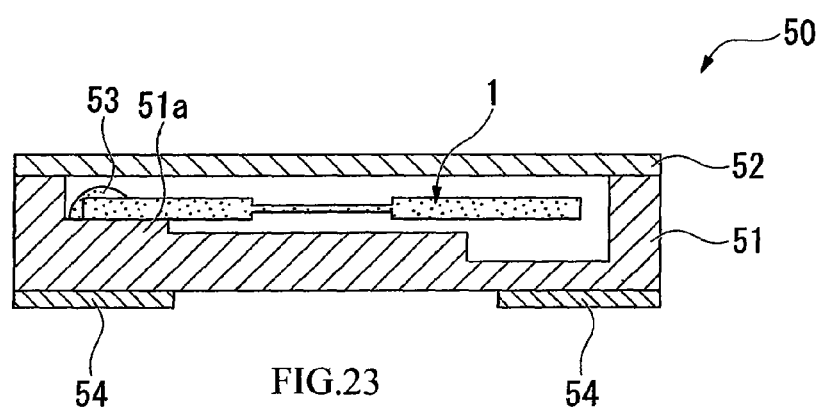
FIG. 23 is a cross-sectional view of a cutting line C-C shown in FIG. 22.

As shown in FIGS. 22 and 23, the piezoelectric vibrator 50 of the present embodiment includes the piezoelectric vibrating reed 1, the base 51 and a lid 52 formed of metal or glass. The base portion 4 of the piezoelectric vibrating reed 1 is fixed by being attached to a bonding portion 51*a* of the base 51 by a conductive adhesive 53. Furthermore, the base 51 is sealed in a vacuum airtight manner by the lid 52 becoming the cover using various means such as electronic beam welding, vacuum seam welding or bonding by low melting point glass or eutectic metal in the vacuum. Furthermore, the mount electrodes 9 and 10 formed on the base portion 4 of the piezoelectric vibrating reed 1 are electrically connected to the external electrode 54 of the outside of the base 51 by an internal connection (not shown) through the boding portion 51*a*.

Even in the ceramic package type of piezoelectric vibrator 50 configured as above, since it has the piezoelectric vibrating reed 1 having higher quality and higher performance, the piezoelectric vibrator 50 itself can also promote high quality and high performance. Particularly, since the space surrounded by the base 51 and the lid 52 can be set to a vacuum state, similarly, the vibration efficiency of the pair of vibration arm portions 2 and 3 can be improved.

Oscillator

Next, an embodiment of the oscillator according to the present invention will be explained with reference to FIG. 24. In addition, in the present embodiment, an oscillator 60 including the piezoelectric vibrator 40 having the piezoelectric vibrating reed 1 will be described as an example.

Figure 24:
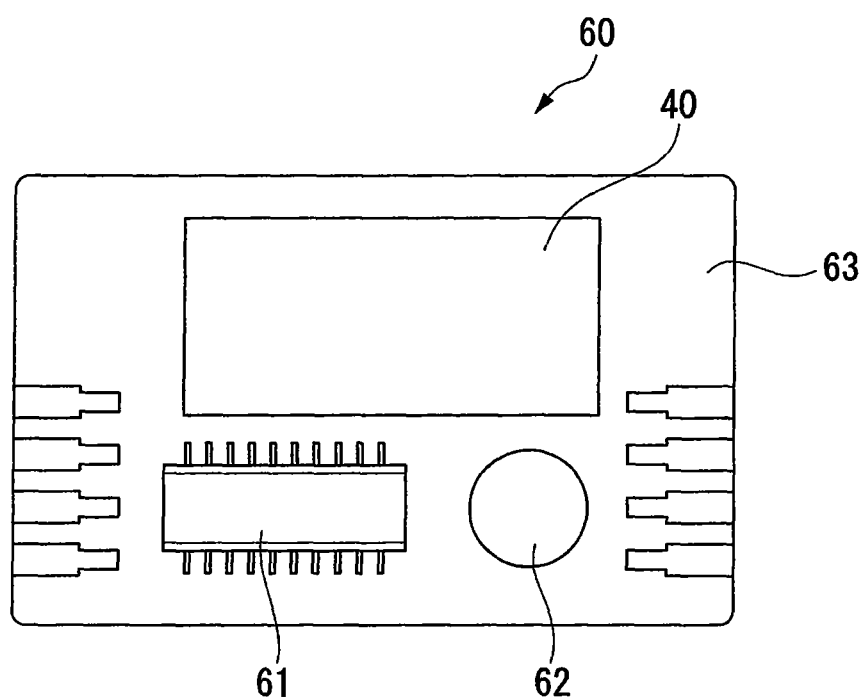
FIG. 24 is a configuration diagram which shows an embodiment of an oscillator having the piezoelectric vibrator according to the invention.

As shown in FIG. 24, an oscillator 60 of the present embodiment is constituted as an oscillator in which the piezoelectric vibrator 40 is electrically connected to an integrated circuit 61. The oscillator 60 includes a substrate 63 on which an electronic component 62 such as a condenser is mounted. The integrated circuit 61 for the oscillator 60 is mounted on the substrate 63, and the piezoelectric vibrating reed 1 of the piezoelectric vibrator 40 is mounted in the vicinity of the integrated circuit 61. The electronic component 62, the integrated circuit 61 and the piezoelectric vibrator 40 are electrically connected to each other by a wiring pattern wiring (not shown), respectively. In addition, the respective constituents are molded by resin (not shown).

In the oscillator 60 configured as above, when the voltage is applied to the piezoelectric vibrator 40, the piezoelectric vibrating reed 1 in the piezoelectric vibrator 40 is vibrated. The vibration is converted to an electric signal by the piezoelectric property of the piezoelectric vibrating reed 1 and input in the integrated circuit 61 as the electric signal. The input electric signal is subjected to the respective processing by the integrated circuit 61 and is output as the frequency signal. As a result, the piezoelectric vibrator 40 functions as the oscillator.

Furthermore, in the configuration of the integrated circuit 61, by selectively setting a RTC (a Real Time Clock) module or the like, for example, depending on the demand, the function of controlling the operating date or time of the equipment or external equipment, in addition to the single function oscillator 60 for timepiece or the like, or providing the time or the calendar or the like can be added.

According to the oscillator 60 of the present embodiment, since it includes the piezoelectric vibrator 40 of a high quality and a high performance, the oscillator 60 itself can also promote high quality and high performance, and the reliability of the product can be improved. Additionally, it is possible to obtain the high precision frequency signal that is stable over a long period of time.

Electronic Equipment

Figure 25:
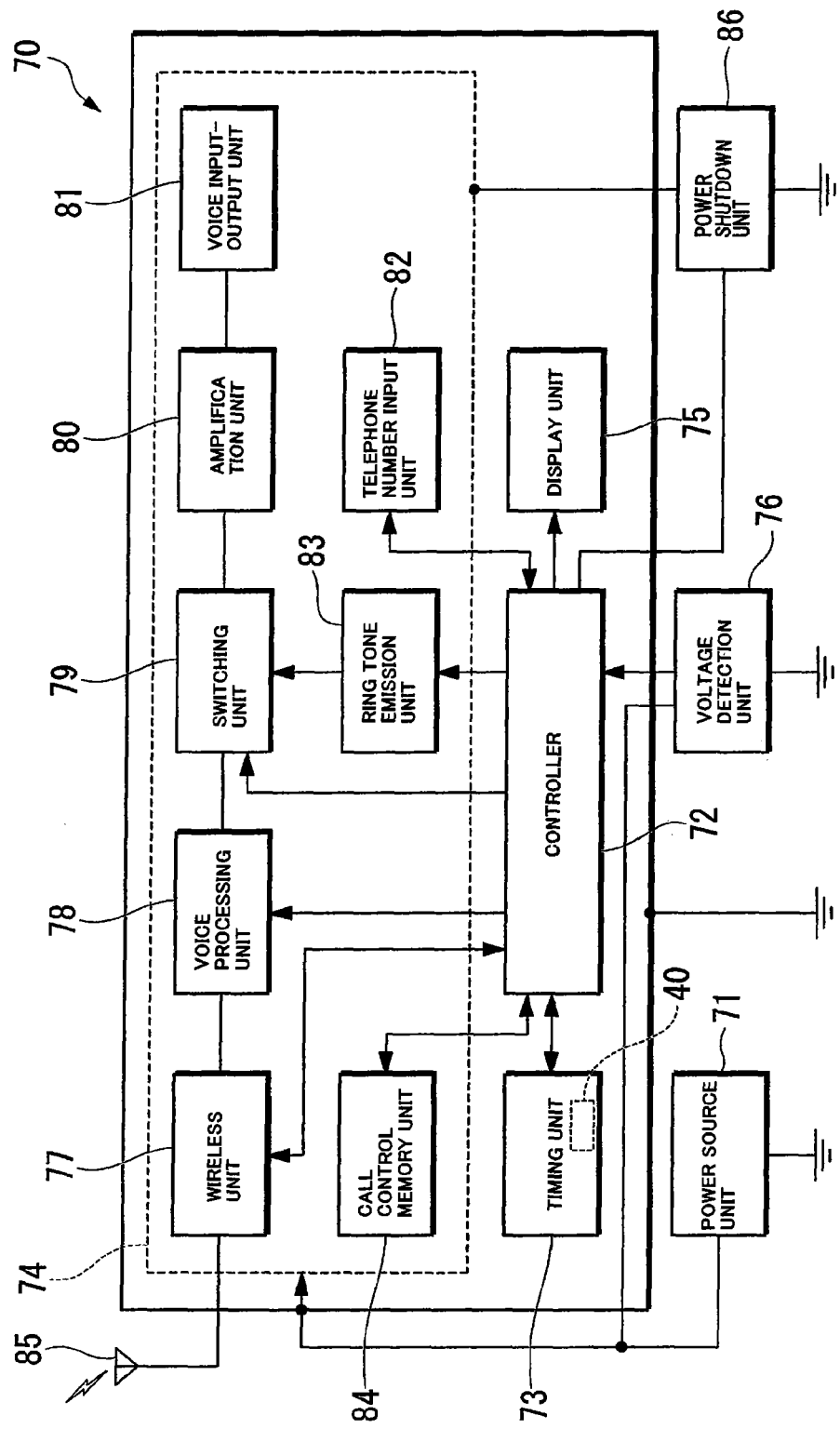
FIG. 25 is a configuration diagram which shows an embodiment of electronic equipment having the piezoelectric vibrator according to the invention.

Next, an embodiment of the electronic equipment according to the present invention will be explained with reference to FIG. 25. Furthermore, as the electronic equipment, portable information equipment 70 having the piezoelectric vibrator 40 having the piezoelectric vibrating reed 1 will be explained as an example.

Firstly, the portable information equipment 70 of the present embodiment is represented by, for example, a mobile phone, and is one in which a wrist watch in the related art is developed and improved. The exterior thereof is similar to a wrist watch, where a liquid crystal display is arranged on a portion equivalent to the hour plate, and the present time or the like can be displayed on the screen. Furthermore, when it is used as a communicator, it can be separated from the wrist and can perform the same communication as the mobile phone of the related art by a speaker and a microphone built in an inner portion of a band. However, as compared to the mobile phone of the related art, it is radically miniaturized and lightened.

Next, the configuration of the portable information equipment 70 of the present embodiment will be explained. As shown in FIG. 25, the portable information equipment 70 includes the piezoelectric vibrator 40 and a power source portion 71 for supplying the electric power. The power source portion 71 includes, for example, a lithium secondary battery. A control portion 72 which performs various controls, a measurement portion 73 performing the count of the time or the like, a communication portion 74 performing the communication with the outside, a display portion 75 displaying various information, and a voltage detection portion 76 detecting the voltage of the respective functional portions are connected to the power source portion 71 in parallel. Moreover, the respective functional portions are provided with the electric power by the power source portion 71.

The control portion 72 controls the respective functional portions to perform the operational control of the whole system such as the transmission and the reception of the sound data, or the measurement or the display of the current time. Furthermore, the control portion 72 includes a ROM with a program written thereon in advance, a CPU that reads and executes the program written on the ROM, and a RAM or the like used as a work area of the CPU.

The measurement portion 73 includes an integrated circuit, which is equipped with an oscillation circuit, a resister circuit, a counter circuit, interface circuit or the like, and the piezoelectric vibrator 40. When the voltage is applied to the piezoelectric vibrator 40, the piezoelectric vibrating reed 1 is vibrated and the vibration is converted to the electric signal by the piezoelectric property of crystal, and is input to the oscillation circuit as the electric signal. The output of the oscillation circuit is binarized and is counted by the resister circuit and the counter circuit. Moreover, the signal is transmitted to and received from the control portion 72 via the interface circuit, and the current time, the current date, the calendar information or the like is displayed on the display portion 75.

The communication portion 74 has the same function as the mobile phone of the related art, and includes a wireless portion 77, a sound processing portion 78, a switch-over portion 79, an amplification portion 80, a sound input and output portion 81, a phone number input portion 82, a ring tone generation portion 83, and a call control memory portion 84.

The wireless portion 77 performs the exchange of the transmission and the reception of various data such as sound data with a base station via an antenna 85. The sound processing portion 78 encodes and decodes the sound signal input from the wireless portion 77 or the amplification portion 80. The amplification portion 80 amplifies the signal, which is input from the sound processing portion 78 or the sound input and output portion 81, to a predetermined level. The sound input and output portion 81 includes a speaker, a microphone or the like, amplifies the ring tone or the receipt sound, or collect the sound.

Furthermore, the receiving sound generation portion 83 creates the receiving sound according to calls from the base station. The switch-over portion 79 switches the amplification portion 80 connected to the sound processing portion 78 to the receiving sound generation portion 83 only for when receiving, whereby the receiving sound created in the receiving sound generation portion 83 is output to the sound input and output portion 81 via the amplification portion 80.

In addition, the call control memory portion 84 stores the program relating to the departure and the arrival of the communication. Furthermore, the phone number input portion 82 includes, for example, number keys from 0 to 9 and other keys, and by pushing the number keys or the like, the phone number of the call destination or the like is input.

The voltage detection portion 76 detects the voltage drop and notifies it to the control portion 72 when the voltage added to the respective functional portions such as the control portion 72 by the power source portion 71 is lower than a predetermined value. The predetermined voltage value of this time is a value which is preset as a minimum voltage necessary for stably operating the communication portion 74, and, for example, is about 3V. The control portion 72 receiving notification of the voltage drop of a voltage detection portion 76 prohibits the operation of the wireless portion 77, the sound processing portion 78, the switch-over portion 79 and the receiving sound generation portion 83. Particularly, stopping the operation of the wireless portion 77 having a high rate of electric power consumption is essential. Furthermore, the intent that the communication portion 74 becomes unusable due to the lack of the battery remaining power is displayed on the display portion 75.

That is, the operation of the communication portion 74 can be prohibited by the voltage detection portion 76 and the control portion 72 and the intent can be displayed on the display portion 75. The display may be a text message, but as a more intuitive display, X (cross) display may be made on a phone icon displayed on the upper portion of the display surface of the display portion 75.

In addition, the power source shut-off portion 86 which can selectively shut off the power source of the portion relating to the function of the communication portion 74 is included, whereby the function of the communication portion 74 can further reliably be stopped.

According to the portable information equipment 70 of the present embodiment, since it includes the piezoelectric vibrator 40 of a high quality and a high performance, the portable information equipment itself also can promote high quality and the high performance. Additionally, it is possible to display the high precision timepiece information which is stable for a long period of time.

Radio-Controlled Timepiece

Next, an embodiment of a radio-controlled timepiece according to the present invention will be explained with reference to FIG. 26. In addition, in the present embodiment, a radio-controlled timepiece including the piezoelectric vibrator 40 having the piezoelectric vibrating reed 1 will be explained as an example.

Figure 26:
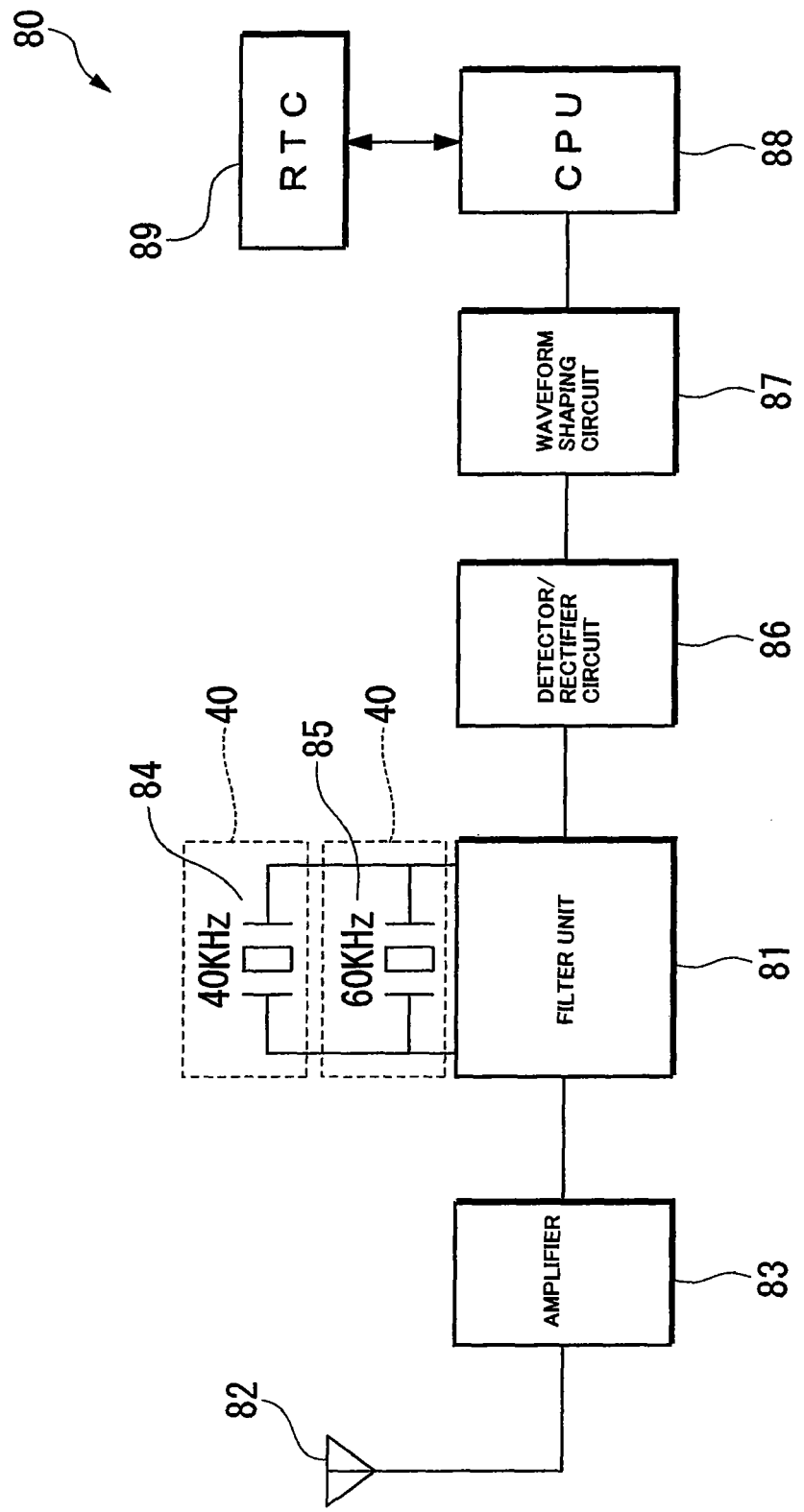
FIG. 26 is a configuration diagram which shows an embodiment of a radio-controlled timepiece having the piezoelectric vibrator according to the invention.
Figure 27:
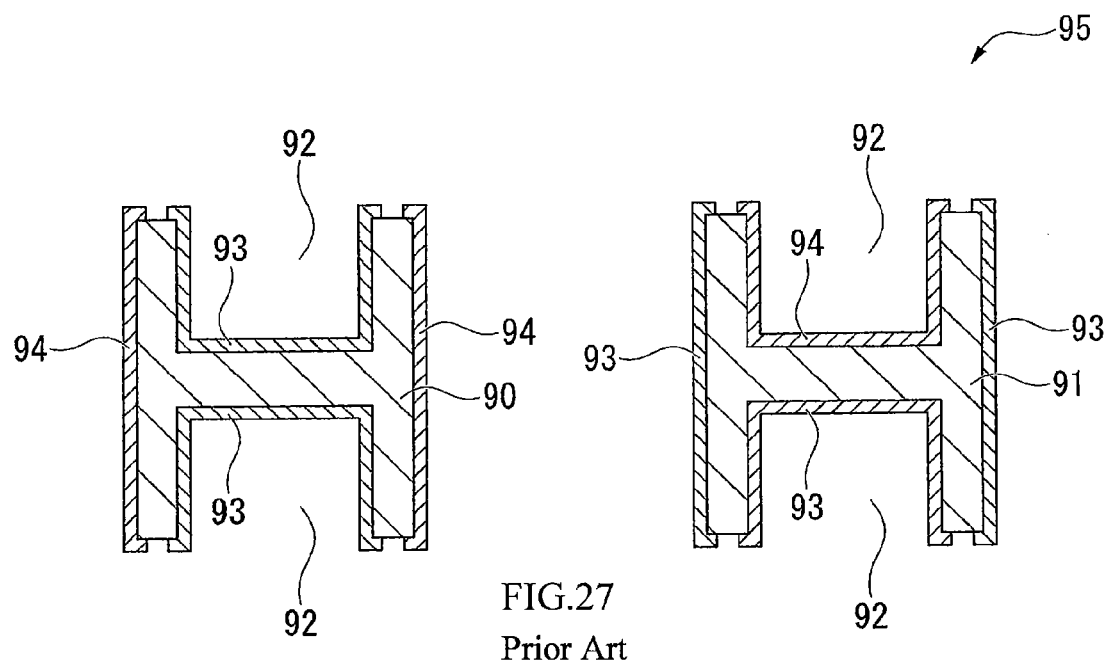
FIG. 27 is a cross-sectional view of a pair of vibration arm portions having groove portions of the related art.
Figure 28:
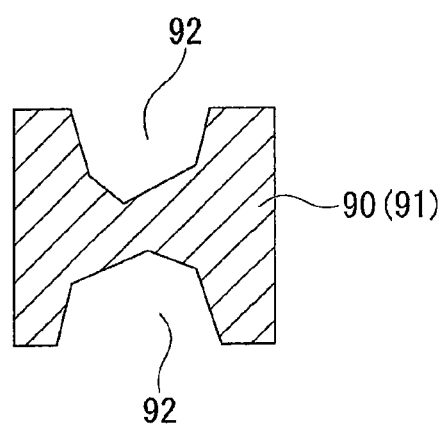
FIG. 28 is a cross-sectional view of a piezoelectric vibrating reed of the related art in which the groove portion becomes a distorted shape by wet etching.

As shown in FIG. 26, a radio-controlled timepiece 80 of the present embodiment is a timepiece which includes the piezoelectric vibrator 40 that is electrically connected to a filter portion 81 and includes the function of receiving standard radio waves including the timepiece information and automatically correcting and displaying the same as the correct time.

In Japan, transmitting stations for transmitting standard radio waves exist in Fukushima prefecture (40 kHz) and Saga prefecture (60 kHz), and each transmits the standard radio waves, respectively. Since long waves such as 40 kHz or 60 kHz have a property of spreading across the surface of the earth and a property of spreading while reflecting between the ionization layer and the surface of the earth, the spreading range is wide, and the above-mentioned two transmitting stations cover the whole of Japan.

Hereinafter, a functional configuration of the radio-controlled timepiece 80 will be explained in detail.

An antenna 82 receives the standard radio waves of the long waves at 40 KHz or 60 KHz. The standard radio waves of the long waves apply an AM modulation to the transport waves of 40 KHz or 60 KHz in a time information called a time code. The standard radio waves of the received long wave are amplified by an amp 83 and are filtered and tuned by a filter portion 81 having a plurality of piezoelectric vibrators 40.

The piezoelectric vibrator 40 of the present embodiment includes crystal vibrator portions 84 and 85 having the same resonant frequencies of 40 kHz and 60 kHz as the transport frequency, respectively.

The signal of the filtered predetermined frequency is detected and demodulated by a detection and rectifier circuit 86. Next, the time code is taken out via a wave shaping circuit 87 and is counted by a CPU 88. In the CPU 88, information such as current year, accumulated date, day of the week, and time is read. The read information is reflected in a RTC 89 and the correct time information is displayed.

Since the transport waves are 40 KHz or 60 KHz, a vibrator having the above-mentioned tuning fork type structure is suitable for the crystal vibrator portions 84 and 85.

In addition, the aforementioned explanation was shown by an example in Japan, but the frequencies of standard radio waves of the long wave differ in foreign countries. For example, standard radio waves of 77.5 KHz are used in Germany. Thus, in a case where the radio-controlled timepiece 80 capable of coping in foreign countries is built in a mobile phone, there is a need for the piezoelectric vibrator 40 having a different frequency from the case in Japan.

According to the radio-controlled timepiece 80 of the present embodiment, since it includes the piezoelectric vibrator 40 of a high quality and a high performance, the radio-controlled timepiece 80 itself can also promote high quality and high performance, and the reliability of the product can be improved. Additionally, it is possible to stably and accurately count the time over a long period of time.

In addition, the technical scope of the invention is not limited to the above embodiments but various modifications can be added within a scope without departing from the gist of the invention.

For example, in the process of forming the groove portion, after a mask member such as a polyimide tape is glued to the area forming the groove portion, the sputtering is performed all over the wafer, and then, after the mask member is removed, the groove portion may be formed by dry etching, but not by the above-mentioned method. That is, after the position corresponding to the groove portion in the wafer is exposed, the groove portion may be formed by dry etching.

INDUSTRIAL AVAILABILITY

The manufacturing method of the piezoelectric vibrating reed according to the present invention can be applied to a piezoelectric vibrator in which the vibration arm portion is formed with a groove portion.

What is claimed is:

1. A method of manufacturing a piezoelectric vibrating reed from a wafer, the piezoelectric vibrating reed including a pair of parallel vibration arm portions, a base portion that integrally fixes proximal ends of the pair of parallel vibration arm portions, and groove portions on opposite surfaces of the pair of vibration arm portions along a longitudinal direction of the vibration arm portions, respectively, the method comprising:

forming a protective film in an area other than on the groove portions; and forming the groove portions by using the protective film as a mask and dry etching the wafer, wherein, forming the protective film further comprises repeatedly forming a first protective film to a predetermined thickness on a first surface of the wafer and forming a second protective film to a predetermined thickness on a second surface of the wafer, the second surface opposite to the first surface, and the first and second protective films comprising substantially the same material.

2. A method of manufacturing the piezoelectric vibrating reed from a wafer, the piezoelectric vibrating reed including a pair of parallel vibration arm portions, a base portion that integrally fixes proximal ends of the pair of vibration arm portions, and groove portions on opposite surfaces of the pair of vibration arm portions along a longitudinal direction of the vibration arm portions, respectively, the method comprising:

forming a patterned protective film in an area other than on the groove portions; and forming the groove portions by dry etching the wafer,
wherein, forming the patterned protective film comprises concurrently forming the protective film is on opposite surfaces of the wafer by positioning the wafer between plate members of a jig and depositing the patterned protective film through openings in the plate members.

3. A piezoelectric vibrator having a piezoelectric vibrating reed manufactured according to the method of claim 1.

4. An oscillator in which the piezoelectric vibrator according to claim 3 is electrically connected to an integrated circuit as an oscillating element.

5. An electronic device in which the piezoelectric vibrator according to claim 3 is electrically connected to a measurement portion.

6. A radio-controlled timepiece in which the piezoelectric vibrator according to claim 3 is electrically connected to a filter portion.

7. The method according to claim 1, wherein forming a first protective film having a predetermined thickness and forming a second protective film having a predetermined thickness comprises forming the first and second protective films to substantially the same thickness.

8. The method according to claim 7, wherein the same thickness comprises 0.25 microns.

9. The method according to claim 2, wherein forming a patterned protective film comprises forming the protective film in the absence of a photoresist material.

\* \* \* \* \*

UNITED STATES PATENT AND TRADEMARK OFFICE
CERTIFICATE OF CORRECTION

PATENT NO. : 8,516,669 B2
APPLICATION NO. : 13/035604
DATED : August 27, 2013
INVENTOR(S) : Takashi Minegishi It is certified that error appears in the above-identified patent and that said Letters Patent is hereby corrected as shown below:

In the Claims

In column 17, claim 2, line 3, after "the protective film" delete "is".

Signed and Sealed this
Eleventh Day of March, 2014

Michelle K. Lee
*Deputy Director of the United States Patent and Trademark Office*